(12) United States Patent
Dorsel et al.

(10) Patent No.: US 7,955,767 B2
(45) Date of Patent: Jun. 7, 2011

(54) METHOD FOR EXAMINING A WAFER WITH REGARD TO A CONTAMINATION LIMIT AND EUV PROJECTION EXPOSURE SYSTEM

(75) Inventors: Andreas Dorsel, Aalen (DE); Stefan Schmidt, Aalen (DE)

(73) Assignee: CARL ZEISS SMT GmbH, Oberkochen (DE)

( * ) Notice: Subject to any disclaimer, the term of this patent is extended or adjusted under 35 U.S.C. 154(b) by 0 days.

(21) Appl. No.: 12/690,571

(22) Filed: Jan. 20, 2010

(65) Prior Publication Data

US 2010/0183962 A1  Jul. 22, 2010

Related U.S. Application Data

(63) Continuation of application No. PCT/EP2008/005807, filed on Jul. 16, 2008.

(60) Provisional application No. 60/951,125, filed on Jul. 20, 2007.

(51) Int. Cl.
*G03F 9/00* (2006.01)
*G03C 5/00* (2006.01)

(52) U.S. Cl. ............ 430/30; 430/311; 430/330; 355/30; 355/67; 355/73; 355/77

(58) Field of Classification Search .................... 430/30, 430/311, 330; 355/30, 67, 73, 77
See application file for complete search history.

(56) References Cited

U.S. PATENT DOCUMENTS

| 6,842,221 | B1 | 1/2005 | Shiraishi | |
| 7,781,157 | B2 * | 8/2010 | Breyta et al. | 430/325 |
| 2010/0112494 | A1 * | 5/2010 | Kraus et al. | 430/322 |

FOREIGN PATENT DOCUMENTS

| EP | 1455233 A2 | 9/2004 |
| GB | 2413645 A | 11/2005 |
| WO | 2008/034582 A2 | 3/2008 |

OTHER PUBLICATIONS

G. Denbeaux et al. "Quantitative Measurement of EUV resist outgassing" 23rd European Mask and Lithography Conference, Proceedings of SPIE, vol. 6533, May 3, 2007, pp. 653318-1-653318-5, online.

J. J. Santillan et al. "A study of EUV resist outgassing characteristics using a novel outgas analysis system" Advances in Resist Materials and Processing Technology XXIV: Proceedings of SPIE, vol. 6519, Mar. 22, 2007, pp. 651944-1-651944-7, online.

T. Watanabe et al. "Novel evaluation system for extreme ultraviolet lithography resist in NewSUBARU" Japanese Journal of Applied Physics, vol. 44, No. 7B, Jul. 26, 2005, pp. 5556-5559, online.

* cited by examiner

*Primary Examiner* — Christopher G Young
(74) *Attorney, Agent, or Firm* — Sughrue Mion, PLLC

(57) ABSTRACT

A method for examining at least one wafer (13) with regard to a contamination limit, in which the contamination potential of the resist (13*a*) of the wafer (13), which resist (13*a*) outgasses contaminating substances, is examined with regard to a contamination limit before the wafer (13) is exposed in an EUV projection exposure system (1). The method preferably includes: arranging the wafer (13) and/or a test disc coated with the same resist (13*a*) as the resist (13*a*) of the wafer (13) in a vacuum chamber (19), evacuating the vacuum chamber (19), and measuring the contamination potential of the contaminating substances outgassed from the wafer (13) in the evacuated vacuum chamber (19), and also comparing the contamination potential of the wafer (13) with a contamination limit. An EUV projection exposure system (1) for carrying out the method is also disclosed. By rejecting wafers having an especially high contamination risk, the contamination of optical elements in the projection exposure system (1) on wafer exposure may be distinctly reduced.

19 Claims, 2 Drawing Sheets

METHOD FOR EXAMINING A WAFER WITH REGARD TO A CONTAMINATION LIMIT AND EUV PROJECTION EXPOSURE SYSTEM

REFERENCE TO RELATED APPLICATIONS

This is a Continuation of International Application PCT/EP2008/005807, with an international filing date of Jul. 16, 2008, which was published under PCT Article 21(2) in English, and the complete disclosure of which is incorporated into this application by reference; the International Application, in turn, claims benefit of U.S. Provisional Application No. 60/951,125, filed Jul. 20, 2007, which is also incorporated into this Continuation by reference.

BACKGROUND OF THE INVENTION

The invention relates to a method for examining at least one wafer with regard to a contamination limit, and to an EUV projection exposure system for carrying out the method.

On the surfaces of optical elements, especially multilayer mirrors, used in EUV projection exposure systems, contaminating substances are progressively deposited during operation. Those substances are produced, for example, by reaction of gases present in the vacuum environment of the optical surfaces with the EUV radiation to form low-volatility solids. Examples of gases that form such a low-volatility oxidize solid with oxidizing radicals produced by the EUV radiation, such as, for example, OH., O., are sulphur, phosphorus, fluorine and silicon compounds, which may outgas from components present in the system. Under irradiation with EUV radiation, gaseous hydrocarbons, typically having a mass number of 45 and above, may also result in a layer of carbon on the optical surfaces. In particular, the contaminating substances mentioned and other contaminating substances may outgas from the wafer provided with a photosensitive layer (resist). That is particularly the case when processing defects occur during the wet-chemical application of the resist to the silicon wafer and during subsequent pre-baking. If temperature management is not optimal during pre-baking, the resist does not cure completely, leading to increased outgassing. A defective composition of the resist or the transporting of the wafer to the EUV projection exposure system may also contribute to the resist outgassing contaminating substances to a greater extent.

As a result of the deposition of those contaminating substances on the optical surfaces of the EUV projection exposure system, those surfaces may be irreversibly damaged, with in some cases enormous costs arising from the downtimes caused during replacement of damaged elements.

It is known to keep the contaminating substances outgassed from the wafer during exposure thereof away from the optical components in the projection exposure system using a stream of gas.

OBJECT OF THE INVENTION

An object of the invention is to provide a method for examining at least one wafer with regard to a contamination limit, and an EUV projection exposure system in which the method may be carried out.

SUMMARY OF THE INVENTION

That object is achieved by a method of the kind mentioned in the introduction, comprising: examining the contamination potential of the resist of the wafer, which resist outgasses contaminating substances, before the wafer is exposed in an EUV projection exposure system. In accordance with the invention, the contamination potential of the wafer is already examined before exposure. In that manner, wafers with which there is a high contamination risk may already be identified and rejected before exposure. That rejection process may proceed automatically or semi-automatically. The optical components of the EUV projection exposure system are in that manner protected from wafers that outgas an especially large number of contaminating substances on exposure.

In one advantageous variant, the examination comprises: arranging the wafer and/or a test disc coated with the same resist as that of the wafer in a vacuum chamber, evacuating the vacuum chamber, and determining the contamination potential of the contaminating substances outgassed from the resist in the evacuated vacuum chamber. The wafers envisaged for exposure may be arranged in the vacuum chamber and have their contamination potential determined individually or in groups. By evacuation of the vacuum chamber, the pressure conditions therein are similar to those in the projection exposure system on exposure of the wafer, and therefore the contamination potential of the wafer or wafers on exposure may be determined. In addition or as an alternative, the examination may also be performed on a test disc coated with the same resist as the resist of the wafer. The test disc passes through the same processing steps as the wafer, preferably passing through the coating process and the subsequent pre-baking operation simultaneously with the wafer. It will be appreciated that any further components that also outgas contaminating substances should not be provided in the vacuum chamber. If their arrangement in the vacuum chamber cannot be avoided, their contamination behavior must be precisely determined before measurement of the contamination potential of the wafer.

Typically, the vacuum chamber for examination of the tendency towards contamination is provided in the EUV projection exposure system in order to test the resist immediately prior to exposure. In this instance, the vacuum chamber is separated from the vacuum chamber in which the optical elements of the exposure system are arranged, for example via a valve. It will be appreciated that the vacuum chamber may, where appropriate, also be provided in a system for examining wafers that is physically separate from the EUV projection exposure system.

In one advantageous variant, the resist to be tested is irradiated in the vacuum chamber, during measurement of the contamination potential, with EUV radiation, especially at a wavelength of from 9 nm to 15 nm, in a region not intended for exposure. The wafer may in this case be irradiated in a portion of its surface, for example at the periphery, with EUV radiation of the exposure wavelength of the EUV projection exposure system. That portion remains unused on subsequent exposure of the wafer in the projection exposure system. As a result of irradiation with EUV radiation, the resist decomposes, in which process decomposition products, such as, for example, $H_2O$ or F—, Cl—, I—, S—, P—or Si-containing molecules or radicals may be liberated and outgassed. To examine the contamination potential of the wafer under irradiation, it is also possible for the test disc to be irradiated with EUV radiation. This has the advantage that the wafer itself remains unexposed and therefore may be later exposed in the projection exposure system without any restriction. It will be appreciated that the intensity of the EUV radiation during wafer testing may, where appropriate, be reduced in comparison with the intensity during exposure.

In an especially advantageous variant, the resist to be tested is irradiated in the vacuum chamber, during measurement of the contamination potential, with charged particles, especially with electrons, in a region not intended for exposure. As an alternative to irradiation with electromagnetic radiation at EUV wavelengths, irradiation conditions may also be simulated by bombardment of the resist with electrically charged particles. Especially suitable for this purpose is an ion or electron gun, which in terms of costs is distinctly more advantageous in comparison with an EUV light source. The power densities (in $W/cm^2$) and the energies of the individual electrons (in eV) should be coordinated in this case in such a way that an outgassing rate equivalent to EUV exposure is obtained for the respective resist or in such a way that the outgassing rate on EUV exposure may be deduced from the outgassing rate on bombardment.

In one advantageous variant, the wafer to be tested and/or the test disc to be tested are heated in the vacuum chamber for measurement of the contamination potential to a temperature of from 50° C. to 600° C., preferably of from 100° C. to 300° C. In order to increase the susceptibility of outgassing substances to detection, during determination of the contamination potential the wafer may be heated to an elevated temperature. This is particularly advantageous for the detection of hydrocarbons with a molecular mass of 45 or more. As a result of the heating, the outgassing of those low-volatility hydrocarbons is intensified by thermal desorption, with the result that they are present in the residual gas in a concentration above the detection limit of conventional residual gas analyzers. A temperature of at least 50° C. and below a maximum temperature for which the resist material is stable, i.e. does not undergo irreversible transformations (due to decomposition, structural changes, etc.) is suitable for that purpose. The absolute value of that maximum temperature depends on the type of resist and usually does not exceed 600° C.

In one preferred variant, in a subsequent step the contamination potential is compared with a contamination limit. In that manner it is possible to identify and reject those wafers which do not meet the requirement with regard to the contamination limit. The contamination limit may in this case be determined empirically. In particular, an individual contamination limit may be specified for each of the outgassing compounds. For example, a different contamination limit may be respectively specified for compounds outgassing from the unexposed resist and for compounds outgassing from the resist under irradiation. The contamination potential may correspond in this case especially to the outgassing rate of one or more contaminating substances which is compared with a maximum outgassing rate specifying the contamination limit.

In an especially preferred development, exclusively those wafers which do not exceed the contamination limit are exposed in a subsequent step in the EUV projection exposure system, so that the optical surfaces in the EUV projection exposure system may be effectively protected from contamination.

Preferably, a wafer that exceeds the contamination limit is heated in a further step to an elevated temperature of from 50° C. to 600° C., especially of from 100° C. to 300° C. Wafers that exceed the contamination limit may be rejected as waste. Alternatively, to reduce the waste, it is possible for such wafers to be pre-baked in order to drive off the outgassing constituents. That is particularly appropriate when the contamination limit for compounds outgassing from the unexposed resist is already exceeded. If the reason for the contamination limit being exceeded lies in the pre-baking process not having been carried out completely owing to the temperature gradient not having been implemented correctly, it is possible for the resist to be fully cured in that manner. For pre-baking, the wafer may be placed, for example, in a further (vacuum) chamber and, after the end of the pre-baking process, may be returned to the vacuum chamber and be again tested there for its contamination potential. If the contamination potential is then below the contamination limit so determined, the wafer may be taken to an exposure position for exposure. In an alternative variant, the contamination behavior of the wafer may be tested continuously during pre-baking. As soon as the contamination potential falls below the predefined contamination limit, pre-baking may be brought to an end.

In a preferred variant, the measuring method for measuring the contamination potential is selected from the group comprising: analyzing a mass spectrum of the residual gas in the evacuated vacuum chamber and measuring the residual pressure in the evacuated vacuum chamber. In the case of the former, residual gas analysis may be carried out with regard to specific contaminating substances and, in the case of the latter, the residual pressure in the evacuated vacuum chamber at a given pump capacity or pump configuration may be used to deduce the general contamination risk on use of the wafer for exposure. If the attainable residual pressure is too high, this indicates an increased risk of contamination.

In an especially advantageous variant, the vacuum chamber is formed on a loadlock for loading an EUV projection exposure system with wafers. The loadlock is provided in the EUV projection exposure system in order to create at the wafer, after removal from a magazine and before placement in an exposure position, the same vacuum conditions as exist at the exposure position in an image plane of the projection exposure system. Since the loadlock is evacuated, it may advantageously be used for carrying out the wafer testing method.

In a further advantageous variant, the contamination potential of the resist is measured in respect of hydrocarbons, preferably with a mass number of more than M=44. In addition or as an alternative, the contamination potential of other substances outgassing from the wafer may also be measured. The nature of those substances depends on the type of resist applied to the wafer. Those other contaminating substances may be, for example, sulphur, phosphorus, fluorine or silicon compounds.

In an especially advantageous variant, the contamination potential is determined from the absolute value of a measured variable that is characteristic of the amount of a contaminating substance in the evacuated vacuum chamber. The measured variable may be the height of a signal peak or of a group of signal peaks produced by a mass spectrometer that are characteristic of one or more specific contaminating substances, i.e. of their molecules or molecular fragments. It will be appreciated that, besides the absolute value, a proportion, or a partial pressure, constituted by the contaminating substance in the total gas atmosphere may be determined if the residual gas pressure in the vacuum chamber is determined, for example, with a pressure gauge. The sum of the partial pressures of a plurality of contaminating substances may also define the contamination potential of the wafer.

In a further advantageous variant, the contamination potential is determined from the ratio of the amount of at least one contaminating substance to the amount of at least one further substance in the vacuum chamber. The further substance may be, for example, water, which cannot be completely eliminated in EUV projection exposure systems. By comparing a measured variable characteristic of the amount of the contaminating substance, for example the height of a peak characteristic of the substance in the mass spectrum, with one or more other peaks associated with other substances, it is possible to deduce the ratio thereof and, from that ratio, it is likewise possible to determine the contamination potential of the wafer. The contamination potential can thus be determined from the mass spectrum both by measurement of the absolute signal peak heights and by comparison of the signal peak heights with one another without an absolute reference quantity.

The invention is also implemented in an EUV projection exposure system having: a first vacuum chamber for exposure of at least one wafer, a second vacuum chamber, in which at least one wafer coated with a resist and/or at least one test disc coated with the same resist as that of the wafer may be arranged for examination with regard to a contamination limit, and a measuring device for determining the contamination potential of substances outgassed from the resist in the second, evacuated vacuum chamber. In the case of the projection exposure system according to the invention, wafers with which there is a high contamination risk may be rejected before exposure, so that the optical elements in the projection exposure system are protected from contaminating substances outgassing from the resist of the wafer on exposure.

In one advantageous embodiment, the measuring device has a residual gas analyzer, preferably a mass spectrometer for analyzing a mass spectrum of the residual gas in the evacuated second vacuum chamber. The mass spectrum may in this case be evaluated as described above by determining the absolute or relative heights of the signal peaks.

In one advantageous embodiment, the EUV projection exposure system has a pressure gauge for measuring a residual pressure in the evacuated second vacuum chamber. If the pressure of the residual gas in the vacuum chamber exceeds a predefined limit indicating an increased contamination potential, the wafer may be rejected.

In a further preferred embodiment, the second vacuum chamber is formed by a loadlock for loading the EUV projection exposure system with wafers. The loadlock, which is present in any case in the EUV projection exposure system, may advantageously be used in this case as a measuring chamber for determining the contamination potential of the wafer.

In one advantageous embodiment, the EUV projection exposure system further comprises a vacuum pump for evacuating the second vacuum chamber. The residual pressure in the vacuum chamber measured for a given configuration, especially a given pump capacity, of the vacuum pump may be used for measuring the contamination potential.

In a further embodiment, there is arranged in the second vacuum chamber an EUV radiation source that is preferably configured to emit EUV radiation at a wavelength of from 9 nm to 15 nm in order to irradiate the resist in a region not intended for later exposure, so that the contamination potential of the resist may be tested also under exposure conditions. It will be appreciated that it is not imperative for the second vacuum chamber to have its own EUV radiation source provided therein in order to produce EUV radiation. Rather, some of the EUV radiation produced during the exposure operation may be diverted for that purpose and passed into the second vacuum chamber, it being possible for the exposure radiation to be filtered in addition in order to reduce its intensity.

In a further, especially advantageous embodiment, a particle generating unit, especially an electron gun, is arranged in the second vacuum chamber in order to simulate exposure conditions in the EUV projection exposure system. It will be appreciated that, where appropriate, other electrically charged particles, for example positively charged ions, may be used to simulate exposure conditions.

In an especially advantageous embodiment, the EUV projection exposure system comprises a heating device for heating at least one wafer and/or test disc placed in the second vacuum chamber. In that manner, the outgassing rate of potentially contaminating substances, especially hydrocarbons with a molecular mass of 45 or more, may be increased; the contamination produced may in this case be extracted with the vacuum pump or a pumping device specifically provided for the purpose.

In an especially preferred development of that embodiment, the projection exposure system comprises a control unit which controls the temperature of the heating element in such a manner that wafers that exceed the contamination limit are heated to an elevated temperature, typically of from 50° C. to 600° C., preferably of from 100° C. to 300° C., and are maintained at the elevated temperature until the contamination potential falls below the contamination limit. In that manner, any pre-baking that has possibly not been fully completed can be made good and the resist can be completely cured, whereby its outgassing rate may be lowered to below the contamination limit. It will be appreciated that the pre-baking process may be discontinued after a predetermined period of time if a contamination potential below the contamination limit cannot be obtained during that period of time. In that case, the wafer is classified as a reject and is discharged from the projection exposure system.

In a further advantageous embodiment, the EUV projection exposure system further comprises a magazine for storage of wafers, and a first transport device for transporting at least one wafer from the magazine into the second vacuum chamber. One or more wafers may in this case be taken simultaneously from the magazine into the second vacuum chamber for measurement with regard to their contamination potential.

In one advantageous development, the first transport device is configured to transport the wafer from the second vacuum chamber back into the magazine if the contamination limit is exceeded. In the magazine, a separate position may be provided in this case for receiving rejected wafers, from which position the rejected wafers may be removed from the projection exposure system automatically or semi-automatically. It will be appreciated that the rejected wafers may also be removed from the projection exposure system in a different way, for example directly from the second vacuum chamber, or may be placed in a magazine for exposed wafers and removed from the projection exposure system from that magazine.

In an especially advantageous embodiment, the EUV projection exposure system comprises a second transport device for transporting a wafer from the second vacuum chamber to an exposure position in the first vacuum chamber, the second transport device being configured to transport the wafer from the second into the first vacuum chamber only if the contamination limit is not exceeded. In that manner, the surfaces of optical elements arranged in the projection exposure system may be protected from the substances outgassing from the resist of wafers having an especially high contamination potential, since those wafers are not brought to the exposure position. It will be appreciated that it is also possible for a plurality of second vacuum chambers to be provided for examining the contamination potential, for example one chamber in which the contamination potential of the resist is tested without irradiation and one or more further chambers in which the tendency towards contamination on irradiation or bombardment or at elevated temperature is determined.

Further features and advantages of the invention will be apparent from the following description of illustrative embodiments of the invention with reference to the Figures of the drawings showing essential details of the invention, and from the claims. The individual features may be implemented in a variant of the invention individually or in any desired combination.

BRIEF DESCRIPTION OF THE DRAWINGS

An illustrative embodiment is illustrated in the schematic drawings and will be explained in the following description. In the drawings.

DETAILED DESCRIPTION OF PREFERRED EMBODIMENTS

Figure 1:
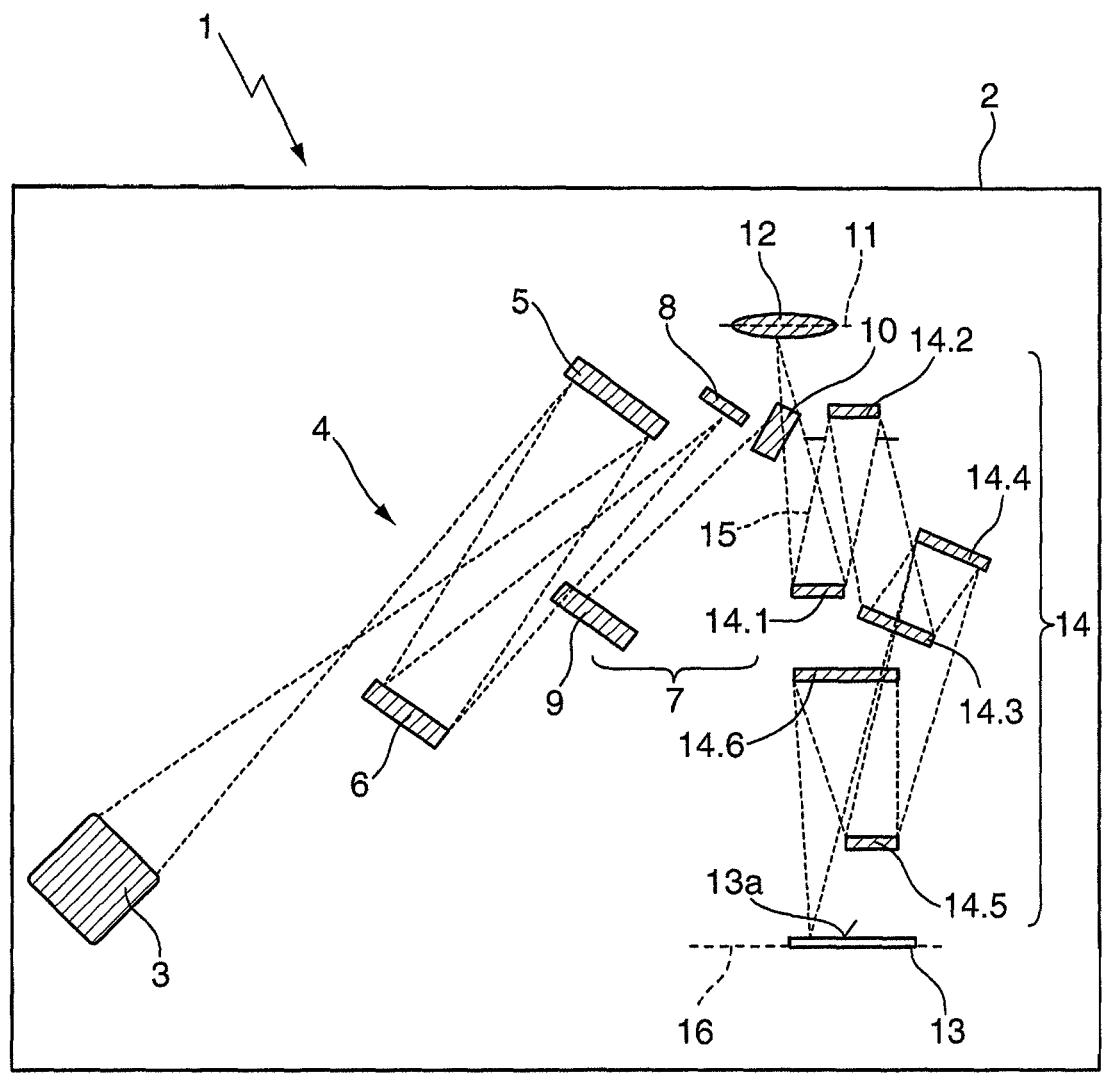
FIG. 1 is a schematic illustration of an EUV projection exposure system according to the invention having a measuring device for determining the contamination potential of a resist, and FIGS. 2a,b are schematic illustrations of a vacuum chamber for examining one or more wafers on irradiation or heating (a) and on bombardment with electrons (b).
Figure 1:
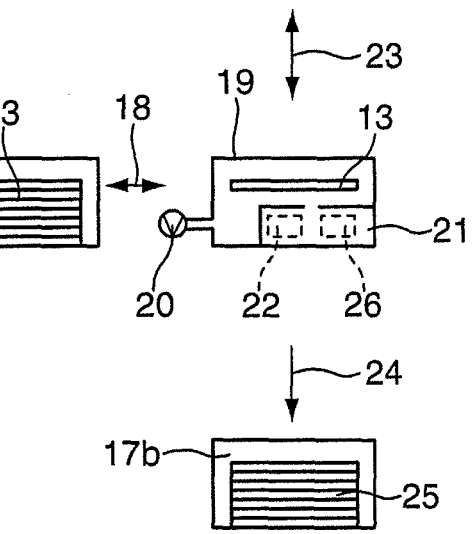

FIG. 1 shows schematically an EUV projection exposure system 1 that has a first vacuum chamber 2. In accordance with the optical function of the optical elements arranged therein, the first vacuum chamber 2 is divided into three housing parts, not depicted in FIG. 1, these being firstly a first housing part with a light generating unit 3 comprising a plasma light source and an EUV collector mirror for focusing the illumination radiation. Arranged in an adjacent, second housing part there is an illumination system 4 which, following the path of the beam, has a mirror 5 with field raster elements and a mirror with pupil raster elements 6. A subsequent group of three mirrors acting as a telescope lens system 7 has a first and a second mirror 8, 9, which are operated under normal incidence, and a third mirror 10 on which the light is incident at a grazing angle. The illumination system 4 produces an as far as possible homogeneous image field in an object plane 11 in which a reticle 12 having a structure (not shown) which is to be reproduced on a smaller scale is arranged.

The structure arranged on the reticle 12 in the object plane 11 is projected by a subsequent projection system 14, which is arranged in a third housing part, onto an image plane 16 in which a wafer 13 with a photosensitive layer (resist 13a) applied to its upper side may be arranged at an exposure position. For the reproduction on a smaller scale, the projection system 14 has six further mirrors 14.1 to 14.6 as reflective optical elements.

In the lower portion of FIG. 1, the procedure for taking the wafer 13 out of a storage position in a magazine 17a to the exposure position in the image plane 16 is shown. The wafer 13 is in this case initially stored with a number of other wafers in the magazine 17a and is taken out of it by a first transport device 18, indicated by a double-headed arrow and also referred to as a "wafer entry lock", which conveys the wafer 13 to a second vacuum chamber 19 and arranges it there at a measuring position. The second vacuum chamber 19 serves as a loadlock for loading the EUV projection exposure system 1 with wafers and for examining the wafer 13 with regard to a contamination limit. The second vacuum chamber 19 is assigned a vacuum pump 20 for producing a high vacuum substantially corresponding to the high vacuum in the first vacuum chamber 2. The interior of the second vacuum chamber 19 is in communication with a measuring device 21 (residual gas analyzer) for determining the contamination potential of contaminating substances outgassed from the wafer 13 in the second vacuum chamber 19 after evacuation.

Those contaminating substances may be hydrocarbons having, in particular, a mass number of 45 (atomic mass units) and above (i.e. the mass numbers thereof are above the mass number of $CO_2$), but, depending on the composition of the resist 13a applied to the wafer 13, other substances, for example sulphur, phosphorus, fluorine or silicon compounds, may also be involved. Provided in the measuring device 21 there is a pressure sensor 22 which measures the residual pressure in the second vacuum chamber 19 after evacuation. From the measured residual gas pressure it is possible to deduce the contamination potential of the wafer 13, since for a given configuration, especially a given pump capacity, of the vacuum pump 20, that residual pressure is an indicator of the contamination risk for the optical elements in the EUV projection exposure system 1 when the wafer 13 is brought into the image plane 16 and exposed there.

If the measured residual gas pressure in the second vacuum chamber 19 exceeds a predefined limit, the wafer 13 is not taken by a second transport device 23, indicated by an arrow, to the exposure position in the image plane 16, but is conveyed, for example, by the first transport device 18 back into the magazine 17a, in which a storage position (not shown) for storage of rejected wafers is formed. From that storage position, the rejected wafers may be removed from the EUV projection exposure system 1 automatically or semi-automatically. Alternatively, the rejected wafers may be taken by a third transport device 24, also referred to as a "wafer exit lock", to a storage position in a further magazine 17b in which exposed wafers 25 also are arranged. From that further magazine 17b also, the rejected wafers may be removed automatically or semi-automatically and subsequently disposed of.

If the residual gas pressure in the second vacuum chamber 19 remains below a contamination limit which the contamination potential must not exceed, the wafer 13 is removed, however, from the second vacuum chamber 19 by the second transport device 23 and taken to the exposure position in the image plane 16.

Establishing the contamination potential by way of the residual pressure in the second vacuum chamber 19 in the manner described above is merely an indicator of a general contamination risk posed by the wafer 13. In order to determine the contamination potential of the wafer 13 with regard to specific contaminating substances, the measuring device 21 further has a mass spectrometer 26. The mass spectrometer 26 (e.g. a quadruple spectrometer) serves to measure the mass spectrum of the gas particles in the second vacuum chamber 19 and has an ion source which ionizes some of the gas mixture remaining in the second vacuum chamber 19, an analyzer system for separating the various gas ions according to their mass/charge ratio, and an ion detection system for measuring the ions or ion streams for the mass/charge ratios that are to be detected.

Signal maxima of the ion streams at one or more mass/charge ratios associated with a specific contaminating substance indicate the presence of that substance in the residual gas atmosphere of the second vacuum chamber 19. The amount of that substance in the second vacuum chamber 19 may therefore be determined by way of the height of the signal peak associated with that substance. Alternatively, it is also possible for the height of the signal peak associated with a contaminating substance to be compared with signal peaks associated with other substances in order to determine the ratio of the amount of the contaminating substance to those substances, for example water, in the residual gas atmosphere. By measuring the residual gas pressure with the pressure sensor 22 it is also possible to determine the respective partial pressure of the contaminating substances in the second vacuum chamber 19. From the measurements respectively determined in this case it is possible to determine the contamination potential of the wafer 13 also with regard to specific contaminating substances and to reject the wafer if a contamination limit specified for such a substance is exceeded. It will be appreciated that, in the measuring device 21 for determining the partial pressures of contaminating substances, devices other than those described above may also be provided, for example optical measuring devices based e.g. on the cavity ringdown method, as are described, for example, in WO 2008/034582 A2 of the Applicant, which regarding this aspect is hereby incorporated into the present application by reference.

Figure 2A:
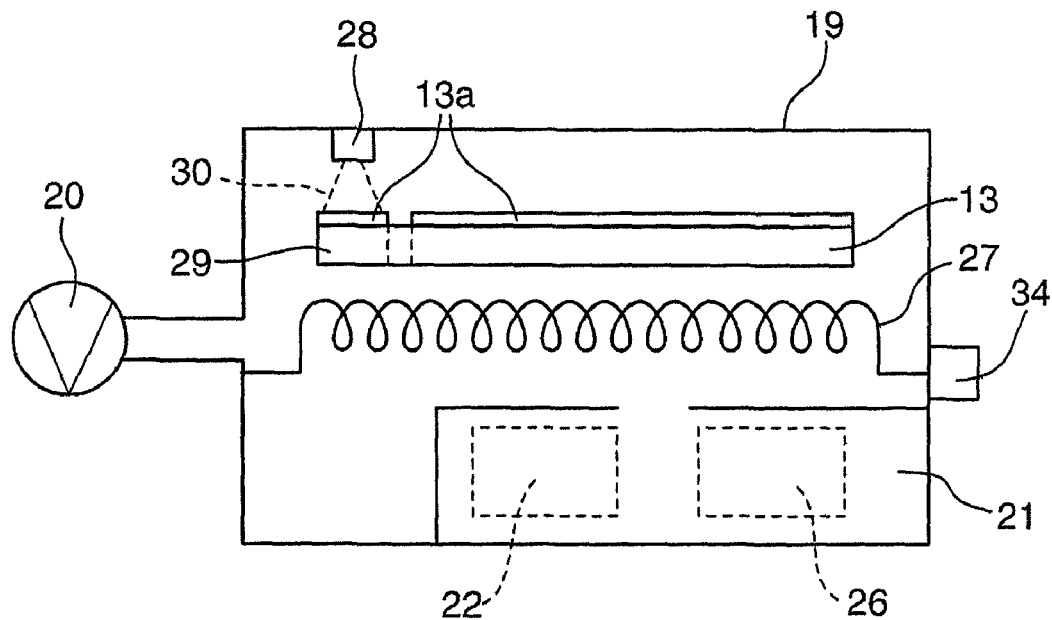

In FIGS. 2a,b, an enlarged view of the second vacuum chamber 19 for measuring the contamination potential is shown in each case. In addition to the measuring device 21 already described with pressure sensor 22 and mass spectrometer 26, the vacuum chamber also contains a heating device 27 in the form of a heating wire which is so arranged that the wafer 13 to be tested may be heated to elevated temperatures typically from 50° C. to 600° C. It will be appreciated that, instead of a heating wire, heating elements of a different geometry may also be used, especially plate-shaped elements.

Heating of the wafer 13 or the resist 13a may on the one hand serve to increase the partial pressure of low-volatility hydrocarbons, i.e. hydrocarbons having a molecular mass of 45 or above, in order in that manner to improve their detectability. On the other hand, the heating device 27 may also be used, in the case of a wafer that exceeds a predefined contamination limit, to drive off the contaminating substances. If the contamination limit is exceeded because a pre-baking processing step of the wafer 13 or the resist 13a was not carried out for a sufficiently long period or at sufficiently high temperatures, pre-baking may be completed by the heating device 27 directly in the vacuum chamber 19, in which case the contaminating substances produced in that process may be removed from the second vacuum chamber 19 by the vacuum pump 20 or by an additional extraction device (not shown). For controlling that process, a control device 34 is provided on the second vacuum chamber 19, which controls the temperature of the heating element 27 in such a manner that wafers that exceed the contamination limit are heated to an elevated temperature of from 50° C. to 600° C. and maintained at the elevated temperature until the contamination potential falls below the contamination limit. A partial pressure $p(C_xH_y)$ for heavy hydrocarbons of approximately $10^{-10}$ mbar to $10^{-12}$ mbar, for example, may be specified as the contamination limit. For a vacuum pump 20 that is implemented as a turbo molecular pump with a typical pumping capacity of 100 liters/sec to 1000 liters/sec, these partial pressures may be obtained with outgassing rates of about $10^{-7}$ mbar liters/sec to about $10^{-10}$ mbar liters/sec.

It will be appreciated that, as an alternative, if the wafer 13 exceeds the contamination limit, it may first be rejected, i.e. taken to one of the magazines 17a, 17b, and may be treated in a separate heating chamber so as not to reduce the wafer throughput. The heating chamber may, where appropriate, also be provided in the projection exposure system itself if there is the possibility there of storing wafers that are to be heated.

In addition to the heating device 27, there is also arranged in the second vacuum chamber 19 an EUV radiation source 28 that emits EUV radiation of the irradiation wavelength, in this case 13.5 nm. The radiation source 28 is so configured and, where appropriate, provided with apertures, not shown here, that EUV radiation 30 impinges only on a test disc 29 coated with the same resist 13a as the wafer 13. The test disc 29 is in this case placed in the second vacuum chamber 19 together with the wafer 13 and may be supported for that purpose in a common holder (not shown). To ensure that the radiation intensity impinging on the resist 13a is so small that no additional heating takes place, a filter (not shown) for the radiation source 28 may additionally be provided. Irradiation during measurement makes it possible to detect its contamination potential also in respect of contaminating substances that are formed only on irradiation as a result of decomposition of the resist 13a. The EUV radiation simulates in that case the conditions obtained during exposure operation in the image plane 16.

Figure 2B:
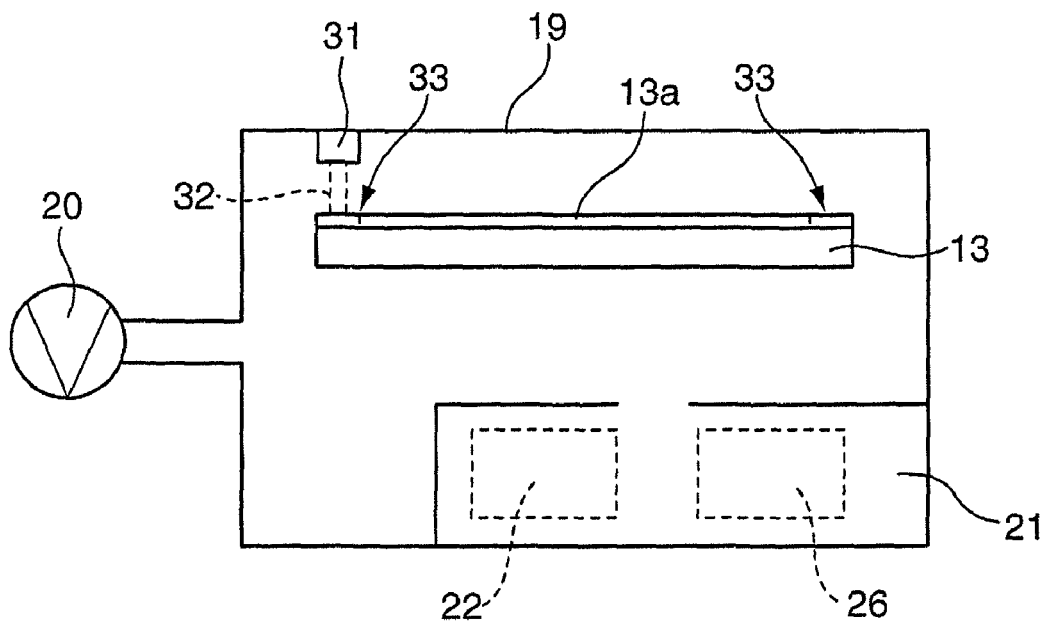

An alternative possibility of simulating the conditions obtained at the wafer 13 in exposure operation will be described hereinafter with reference to the vacuum chamber 19 shown in FIG. 2b. In that chamber, an electron gun 31 is provided as a particle generating device which directs an electron beam 32 onto a ring-shaped peripheral region 33 of the wafer 13, which region is not intended for exposure. In order to irradiate the peripheral region 33 of the resist 13a with electrons as uniformly as possible, the electron gun 31 and/or the wafer 13 may be moved, in particular turned, relative to each other with a suitable movement device. The power density of the electron beam 32 and the energies of the individual electrons may in this case be coordinated in such a way that an outgassing rate equivalent to or correlated with that of exposure operation is obtained for the respective resist 13a, so that the contamination potential of the wafer 13 or the resist 13a may also be determined in that manner.

Using one or more of the procedures described above it is possible to determine the contamination potential of wafers before they are exposed in the EUV projection exposure system 1. The contamination risk is dependent here on the outgassing rates (partial pressures) and/or on the nature of the outgassed substances (e.g. occurrence of critical molecular fragments). By rejecting wafers having an especially high contamination risk, the contamination of optical elements in the projection exposure system on wafer exposure may be distinctly reduced, with the result that the downtimes of the projection exposure system due to replacement of irreversibly contaminated optical elements may be reduced and, in turn, cost savings can be achieved.

The above description of preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for examining at least one wafer with regard to a contamination limit, comprising:
    examining a contamination potential of a resist of the wafer, which resist outgasses contaminating substances, in an examining location;
    removing the wafer from the examining location directly to an exposure location if the contamination potential is less than the contamination limit; and
    exposing the wafer at the exposure location in a projection exposure system that operates in an extreme ultraviolet wavelength range;

wherein the examining comprises:
arranging the wafer in a vacuum chamber comprising the examining location,
evacuating the vacuum chamber, and
measuring the contamination potential of the contaminating substances outgassed from the resist in the evacuated vacuum chamber,
and wherein, during the measuring of the contamination potential, the resist is at least one of: irradiated with extreme ultraviolet wavelength radiation and bombarded with particles, in a region of the resist not included in the exposing of the wafer.

2. The method according to claim 1, wherein the resist is exclusively irradiated, during the measuring of the contamination potential, with extreme ultraviolet wavelength radiation having a wavelength between 9 nm and 15 nm in the region of the resist not included in the exposing of the wafer.

3. The method according to claim 1, wherein the resist, during the measuring of the contamination potential, is exclusively bombarded with particles in the region not included in the exposing of the wafer.

4. The method according to claim 1, further comprising heating the wafer in the vacuum chamber during the measuring of the contamination potential to a temperature between 50° C. and 600° C.

5. The method according to claim 1, further comprising comparing the contamination potential with a contamination limit.

6. The method according to claim 5, further comprising positioning the wafer in a location separate from the exposure location if the contamination potential exceeds the contamination limit.

7. The method according to claim 6, further comprising heating the positioned wafer having the contamination potential that exceeds the contamination limit to an elevated temperature between 50° C. and 600° C.

8. The method according to claim 7, further comprising maintaining the wafer at least the elevated temperature until the contamination potential falls below the contamination limit.

9. A projection exposure system configured for operation at an extreme-ultraviolet wavelength, comprising:
a first vacuum chamber configured to expose at least one wafer coated with a resist;
a second vacuum chamber configured to arrange the at least one wafer coated with the resist;
a measuring device configured to examine a contamination potential of substances outgassed from the resist in the second, evacuated vacuum chamber; and
a device configured to transfer the at least one wafer directly from the second vacuum chamber into the first vacuum chamber if the contamination potential of the substances outgassed from the resist is less than a given contamination limit;
wherein the second vacuum chamber comprises at least one of: a radiation source configured to emit extreme ultraviolet wavelength radiation and a particle generating unit.

10. The projection exposure system according to claim 9, wherein the measuring device comprises a mass spectrometer configured to analyze a mass spectrum of residual gas in the evacuated second vacuum chamber.

11. The projection exposure system according to claim 9, further comprising a pressure gauge configured to measure a residual pressure in the evacuated second vacuum chamber.

12. The projection exposure system according to claim 9, wherein a loadlock configured to load the first vacuum chamber with wafers comprises the second vacuum chamber.

13. The projection exposure system according to claim 9, wherein the second vacuum chamber comprises exclusively the radiation source configured to emit extreme ultraviolet wavelength radiation having a wavelength between 9 nm and 15 nm.

14. The projection exposure system according to claim 9, wherein the second vacuum chamber comprises exclusively the particle generating unit and wherein the particle generating unit comprises an electron gun.

15. The projection exposure system according to claim 9, further comprising a heating device configured to heat the wafer in the second vacuum chamber.

16. The projection exposure system according to claim 15, further comprising a control unit configured to control a temperature of the heating device such that if the contamination potential for the wafer exceeds the contamination limit, the heating device heats the wafer to an elevated temperature of between 50° C. and 600° C., and maintains the elevated temperature until the contamination potential falls below the contamination limit.

17. The projection exposure system according to claim 9, wherein the device comprises a magazine configured to store wafers and a first transport device configured to transport at least one of the stored wafers from the magazine into the second vacuum chamber.

18. The projection exposure system according to claim 17, wherein the first transport device is configured to transport the at least one wafer from the second vacuum chamber back into the magazine if the contamination potential for the at least one wafer exceeds the contamination limit.

19. The projection exposure system according to claim 17, wherein the device further comprises a second transport device configured to transport the at least one wafer from the second vacuum chamber to an exposure position in the first vacuum chamber if the contamination potential for the at least one wafer is less than the contamination limit.

* * * * *

UNITED STATES PATENT AND TRADEMARK OFFICE
CERTIFICATE OF CORRECTION

PATENT NO. : 7,955,767 B2
APPLICATION NO. : 12/690571
DATED : June 7, 2011
INVENTOR(S) : Andreas Dorsel et al.

It is certified that error appears in the above-identified patent and that said Letters Patent is hereby corrected as shown below:

Column 1, Line 28: Delete "oxidize" and insert -- oxidic --

Column 7, Line 41: Delete "reticule" and insert -- reticle --

Column 7, Line 44: Delete "reticule" and insert -- reticle --

Column 8, Line 48: Delete "quadruple" and insert -- quadrupole --

Column 11, Line 38: In Claim 8, delete "wafer at least" and insert -- wafer at at least --

Signed and Sealed this
Ninth Day of April, 2013

Teresa Stanek Rea
*Acting Director of the United States Patent and Trademark Office*